United States Patent
Seetharaman et al.

(10) Patent No.: US 11,984,181 B2
(45) Date of Patent: May 14, 2024

(54) SYSTEMS AND METHODS FOR EVALUATING INTEGRITY OF ADJACENT SUB BLOCKS OF DATA STORAGE APPARATUSES

(71) Applicant: Western Digital Technologies, Inc., San Jose, CA (US)

(72) Inventors: Srinivasan Seetharaman, Milpitas, CA (US); Sourabh Sankule, Bangalore (IN); Piyush Girish Sagdeo, Santa Clara, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 364 days.

(21) Appl. No.: 16/457,166

(22) Filed: Jun. 28, 2019

(65) Prior Publication Data

US 2020/0409808 A1     Dec. 31, 2020

(51) Int. Cl.
| | |
|---|---|
| *G11C 29/44* | (2006.01) |
| *G06F 11/20* | (2006.01) |
| *G11C 29/38* | (2006.01) |
| *G11C 29/04* | (2006.01) |

(52) U.S. Cl.
CPC .......... *G11C 29/44* (2013.01); *G06F 11/2094* (2013.01); *G11C 29/38* (2013.01); *G06F 2201/82* (2013.01); *G11C 2029/0409* (2013.01)

(58) Field of Classification Search
CPC ........ G11C 2029/0409; G11C 16/3418; G11C 16/3427; G11C 16/3431; G11C 29/38; G11C 29/44; G06F 11/2094; G06F 2201/82; G06F 11/106
See application file for complete search history.

(56) References Cited

U.S. PATENT DOCUMENTS

| | | | | |
|---|---|---|---|---|
| 5,155,844 | A  * | 10/1992 | Cheng | G11C 29/08 |
| | | | | 714/E11.151 |
| 2010/0070682 | A1* | 3/2010 | Wan | G06F 12/0246 |
| | | | | 711/E12.008 |
| 2010/0235691 | A1* | 9/2010 | Chen | G11C 29/14 |
| | | | | 714/E11.169 |
| 2010/0275073 | A1* | 10/2010 | Lasser | G11C 29/26 |
| | | | | 714/E11.159 |
| 2013/0223147 | A1* | 8/2013 | Kwak | G11C 16/3427 |
| | | | | 365/185.11 |
| 2016/0005468 | A1* | 1/2016 | Lee | G11C 5/063 |
| | | | | 365/185.11 |

(Continued)

*Primary Examiner* — Steve N Nguyen
(74) *Attorney, Agent, or Firm* — LOZA & LOZA, LLP; Gabriel Fitch

(57) ABSTRACT

The disclosure relates in some aspects to a design for a data storage apparatus with a non-volatile memory that includes a block of memory comprising N wordlines partitioned into a first sub-block comprising a first subset of the N wordlines and a second sub-block comprising a second subset of the N wordlines different than the first subset. In some aspects, the disclosure relates to detecting a failure in a first sub-block. The second sub-block is then marked, in response to a failure detection in the first sub-block, with an initial designation as an unusable sub-block, and a test of the second sub-block is performed to determine a usability of the second sub-block. Based on the test, the second sub-block is then marked with a second designation that is one of a tested usable sub-block or a tested unusable sub-block.

23 Claims, 10 Drawing Sheets

(56) References Cited

U.S. PATENT DOCUMENTS

| | | | |
|---|---|---|---|
| 2016/0172056 A1* | 6/2016 | Huh | G11C 16/3495 |
| | | | 714/719 |
| 2016/0293274 A1* | 10/2016 | Schuh | G11C 29/44 |
| 2018/0032442 A1* | 2/2018 | Turean | G11C 5/143 |
| 2018/0373605 A1* | 12/2018 | Kim | G06F 3/0685 |
| 2019/0362798 A1* | 11/2019 | Yang | G06F 11/1048 |

* cited by examiner

SYSTEMS AND METHODS FOR EVALUATING INTEGRITY OF ADJACENT SUB BLOCKS OF DATA STORAGE APPARATUSES

FIELD

The disclosure relates, in some embodiments, to data storage apparatuses and memory controllers for use therewith. More specifically, but not exclusively, the disclosure relates to systems and methods for evaluating the integrity of adjacent sub blocks of a data storage apparatus, such as a solid state device.

INTRODUCTION

Solid state devices (such as a solid state drive), hereinafter referred to as an SSD incorporating one or more non-volatile memories (NVMs), such as NAND flash memories and NOR flash memories (hereinafter flash memory will refer to either of NAND flash memory or NOR flash memory), are replacing or supplementing conventional rotating hard disk drives for mass storage in many consumer or industrial electronics and computers. In a typical SSD-based product, a host computing device includes or communicates with an NVM device controller that in turn controls access to one or more NVM devices.

With respect to flash memories, it should be noted that such memories are susceptible to corruption due to various factors. For instance, data in flash memories may be corrupted by ordinary read, program and erase sequences, where memory cells in physical proximity to those that are subject to a read, program or erase action may be unintentionally stressed. Such stress may alter stored charge levels to a point where bit errors are induced in those memory cells. With respect to read operations, read stress is induced not only on the memory cells of the word line being read but also when the read voltage is applied to other word lines in a physical memory block of the flash memory. The stress on memory cells of word lines not being read is sometimes referred to as a read disturb effect.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

One embodiment of the disclosure provides a data storage apparatus that includes a processor coupled to a non-volatile memory in which a block comprising N wordlines is partitioned into a first sub-block and a second sub-block. For this embodiment, the first sub-block comprises a first subset of the N wordlines and the second sub-block comprises a second subset of the N wordlines different than the first subset. In one example, the processor may be configured to detect a failure in the first sub-block. For this example, in response to a failure detection in the first sub-block, the processor may be further configured to mark the second sub-block with an initial designation as an unusable sub-block. The processor may also be configured to perform at least one test on the second sub-block to determine a usability of the second sub-block, and further configured to mark, based on the at least one test, the second sub-block with a second designation that is one of a tested usable sub-block or a tested unusable sub-block.

In another embodiment of the disclosure, a data storage method operable on a non-volatile memory is disclosed in which the non-volatile memory includes a block comprising N wordlines partitioned into a first sub-block and a second sub-block. For this embodiment, the first sub-block comprises a first subset of the N wordlines and the second sub-block comprises a second subset of the N wordlines different than the first subset. In one example, the method includes detecting a failure in the first sub-block. The method may further include marking, in response to a failure detection in the first sub-block, the second sub-block with an initial designation as an unusable sub-block. The method may also include performing at least one test on the second sub-block to determine a usability of the second sub-block, and marking, based on the at least one test, the second sub-block with a second designation that is one of a tested usable sub-block or a tested unusable sub-block.

In a further embodiment of the disclosure, another data storage apparatus is provided, which includes a non-volatile memory having a block comprising N wordlines partitioned into a first sub-block and a second sub-block. For this embodiment, the first sub-block comprises a first subset of the N wordlines and the second sub-block comprises a second subset of the N wordlines different than the first subset. In one example, the apparatus includes means for detecting a failure in the first sub-block. The apparatus may further include means for marking the second sub-block, in response to a failure detection in the first sub-block, with an initial designation as an unusable sub-block. The apparatus may also include means for performing at least one test on the second sub-block to determine a usability of the second sub-block, and means for marking, based on the at least one test, the second sub-block with a second designation that is one of a tested usable sub-block or a tested unusable sub-block.

In yet another embodiment of the disclosure, a non-transitory computer-readable medium storing computer-executable code for storing data is disclosed. In a particular example, the non-transitory computer-readable medium is operable on a non-volatile memory that includes a block comprising N wordlines partitioned into a first sub-block and a second sub-block. For this embodiment, the first sub-block comprises a first subset of the N wordlines and the second sub-block comprises a second subset of the N wordlines different than the first subset. In this example, the computer-readable medium may include code to perform various tasks, including to detect a failure in the first sub-block. The computer-readable medium may also include code to mark the second sub-block, in response to a failure detection in the first sub-block, with an initial designation as an unusable sub-block. The computer-readable medium may then further include code to perform at least one test on the second sub-block to determine a usability of the second sub-block, as well as code to mark, based on the at least one test, the second sub-block with a second designation that is one of a tested usable sub-block or a tested unusable sub-block.

These and other aspects of the disclosure will become more fully understood upon a review of the detailed description, which follows. Other aspects, features, and implementations of the disclosure will become apparent to those of ordinary skill in the art, upon reviewing the following description of specific implementations of the disclosure in conjunction with the accompanying figures. While features of the disclosure may be discussed relative to certain implementations and figures below, all implementations of the disclosure can include one or more of the advantageous features discussed herein. In other words, while one or more implementations may be discussed as having certain advantageous features, one or more of such features may also be used in accordance with the various implementations of the disclosure discussed herein. In similar fashion, while certain implementations may be discussed below as device, system, or method implementations it should be understood that such implementations can be implemented in various devices, systems, and methods.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
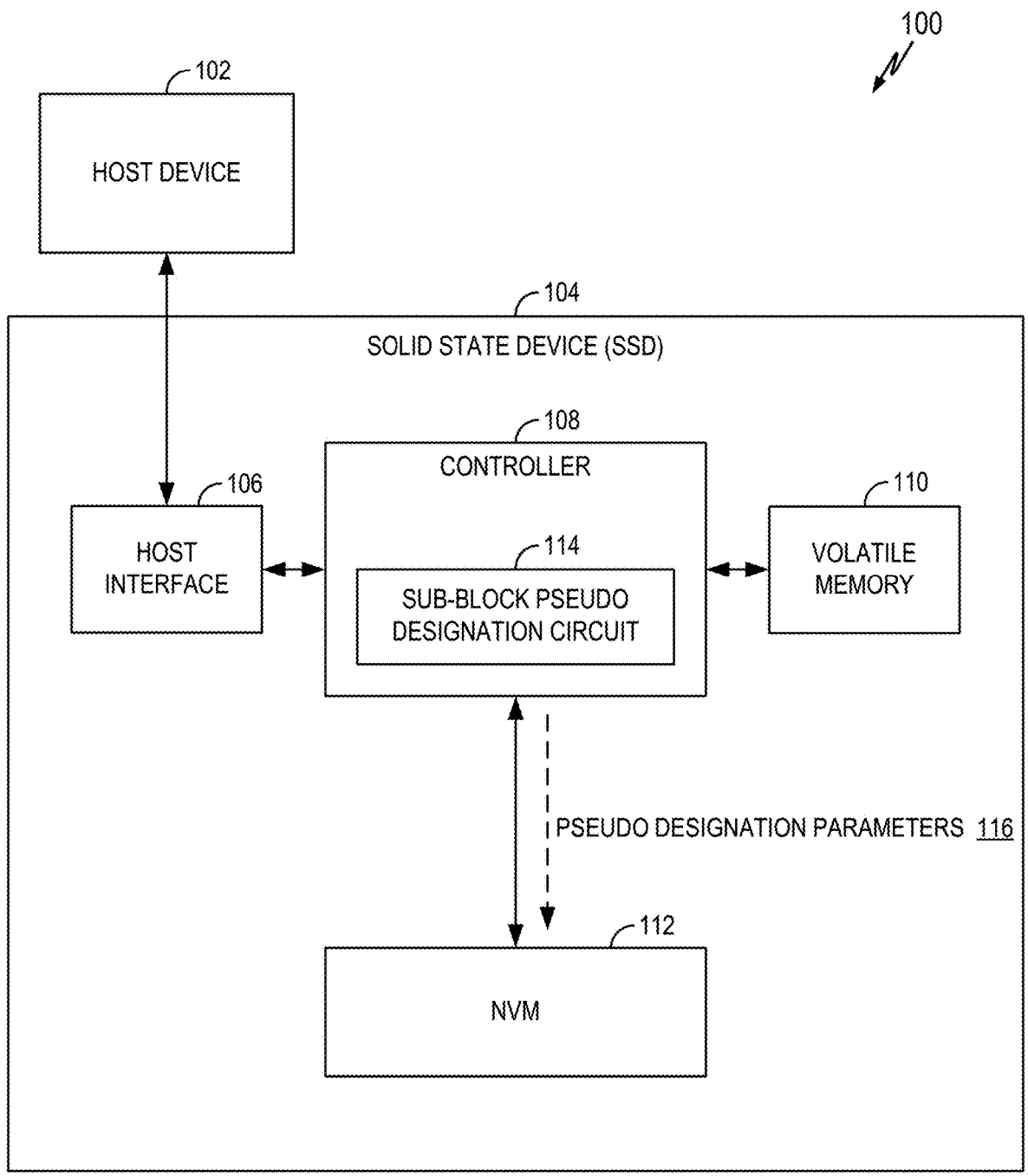
FIG. 1 illustrates an example memory system including a solid state device (SSD) configured in accordance with one or more aspects of the disclosure.

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

To mitigate the potential harm caused by a read disturb, a read scrub algorithm may be implemented to keep a check on the quality of data stored in each physical block of a flash memory. If a data quality issue is detected, the data is relocated to a new location before it becomes unreadable. As the architecture of physical blocks evolves, however, it is anticipated that relocating such data may become inapplicable and/or inefficient. Accordingly, an improved methodology that is compatible with new physical block architectures is desirable and disclosed herein.

For purposes of illustration, various aspects of the disclosure will be described in the context of a memory system that includes NAND memory technology. A NAND device may be referred to herein as a NAND Flash memory, a NAND memory device, a NAND flash, or a NAND. Generally speaking, a NAND device is a non-volatile memory having high storage density, fast access time, low power requirements in operation and advantageous shock resistance, compared to more conventional memory platforms. Raw NAND devices may be equipped (e.g., configured) with a serial interface such as Open NAND Flash Interface (ONFi), Common Flash Memory Interface (CFI), and the like. NAND devices may be configured as discrete memory chips or packaged with a controller to form a secure digital (SD) memory card, Multi Media Card (MMC), or a solid state disk. A NAND device may be configured with a single flash die, or a plurality of dies. In addition to memory cells, a NAND device may include other components, such as control/address logic components, I/O components, and data register components. It should be appreciated that the teachings herein are also applicable to other forms of memory (e.g., NVM other than NAND devices).

As previously stated, phenomena like program disturb errors, read disturb errors and data retention errors tend to affect the integrity of data stored in NAND arrays. Indeed, such phenomena can cause an undesirably high failed block count (FBC), and may eventually result in uncorrectable error correction code (UECC) events. To this end, although conventional read scrub algorithms are designed to relocate data stored in a NAND device before these events occur, such algorithms may be inadequate for architectures in which a physical block is logically partitioned into sub-blocks. Namely, when applied to a sub-block architecture, conventional read scrub methods may be inefficient since a failure detected in one sub-block may not necessarily affect the other sub-block. Moreover, blindly relocating data in one sub-block whenever a failure is detected in the other sub-block is inefficient since the failure may have been caused by a local issue limited to a single sub-block, rather than a global issue affecting both sub-blocks.

In view of the above deficiencies, the disclosure relates in some aspects to a design for a physical block of non-volatile memory (e.g., NAND flash memory) logically partitioned into sub-blocks. In some aspects, rather than automatically relocating data, a sub-block design is disclosed in which a pseudo designation is assigned to a sub-block upon detecting a failure in the other sub-block, wherein the pseudo designation designates a sub-block as "potentially" unusable. Sub-blocks having such a pseudo designation are then further tested to determine whether the failure in the other sub-block was a local issue (i.e., where the pseudo designation may be replaced with a "usable" designation) or a global issue (i.e., where the pseudo designation may be replaced with an "unusable" designation). These aspects and other aspects of the disclosure will now be described in more detail in conjunction with FIGS. 1-8.

Example Memory System

FIG. 1 illustrates an embodiment of a memory system 100 that includes a host device 102 and a solid state device (SSD) 104 communicatively coupled to the host device 102. A data storage device/apparatus may include one or more SSDs. The host device (e.g., a host computer) 102 provides commands to the SSD 104 for transferring data between the host device 102 and the SSD 104. For example, the host device 102 may provide a write command to the SSD 104 for writing data to the SSD 104 or a read command to the SSD 104 for reading data from the SSD 104. The host device 102 may be any system or device having a need for data storage or retrieval and a compatible interface for communicating with the SSD 104. For example, the host device 102 may be a computing device, a personal computer, a portable computer, or workstation, a server, a personal digital assistant, a digital camera, a digital phone, or the like.

The SSD 104 includes a host interface 106, a controller 108, a volatile memory 110, and a non-volatile memory (NVM) 112. The host interface 106 is coupled to the controller 108 and facilitates communication between the host device 102 and the controller 108. Additionally, the controller 108 is coupled to the volatile memory 110 and the NVM 112. The host interface 106 may be any type of communication interface, such as an Integrated Drive Electronics (IDE) interface, a Universal Serial Bus (USB) interface, a Serial Peripheral (SP) interface, an Advanced Technology Attachment (ATA) interface, a Small Computer System Interface (SCSI), an IEEE 1394 (Firewire) interface, or the like. In some embodiments, the host device 102 includes the SSD 104 (e.g., the host device 102 and the SSD 104 are implemented as a single component). In other embodiments, the SSD 104 is remote with respect to the host device 102 or is contained in a remote computing system coupled in communication with the host device 102. For example, the host device 102 may communicate with the SSD 104 through a wireless communication link.

The controller 108 controls operation of the SSD 104. In various embodiments, the controller 108 receives commands from the host device 102 through the host interface 106 and performs the commands to transfer data between the host device 102 and the NVM 112. In addition, the controller 108 performs internal operations such as garbage collection operations, data integrity operations, and wear leveling operations. The controller 108 may include any type of processing device, such as a microprocessor, a microcontroller, an embedded controller, a logic circuit, software, firmware, or the like, for controlling operation of the SSD 104.

In some embodiments, some or all of the functions described herein as being performed by the controller 108 may instead be performed by another element of the SSD 104. For example, the SSD 104 may include a microprocessor, a microcontroller, an embedded controller, a logic circuit, software, firmware, or any kind of processing device, for performing one or more of the functions described herein as being performed by the controller 108. In some embodiments, one or more of the functions described herein as being performed by the controller 108 are instead performed by the host device 102. In some embodiments, some or all of the functions described herein as being performed by the controller 108 may instead be performed by another element such as a controller in a hybrid drive including both non-volatile memory elements and magnetic storage elements.

The volatile memory 110 may be any memory, computing device, or system capable of storing data. For example, the volatile memory 110 may be a random-access memory (RAM), a dynamic random-access memory (DRAM), a static random-access memory (SRAM), a synchronous dynamic random-access memory (SDRAM), a flash storage, an erasable programmable read-only-memory (EPROM), an electrically erasable programmable read-only-memory (EEPROM), or the like. In various embodiments, the controller 108 uses the volatile memory 110, or a portion thereof, to store data during the transfer of data between the host device 102 and the NVM 112. For example, the volatile memory 110 or a portion of the volatile memory 110 may be a cache memory.

The controller 108 includes a sub-block pseudo designation circuit 114 for implementing aspects disclosed herein on an NVM 112 logically partitioned into sub-blocks based on pseudo designation parameters 116 sent to the NVM 112. In some embodiments, the controller 108 determines the pseudo designation parameters 116. For example, the controller 108 may define pseudo designation parameters 116 based on particular preferences for when a sub-block shall be assigned a pseudo designation. For instance, aspects disclosed herein include a design that assigns a pseudo designation to a sub-block upon detecting a failure in the other sub-block, wherein the pseudo designation designates a sub-block as "potentially" unusable. In some embodiments, the controller 108 receives the pseudo designation parameters 116 from another entity. In this case, the controller 108 may select a set of pseudo designation parameters 116 to be used by the NVM 112 in view of one or more preferences (e.g., when a sub-block shall be assigned a pseudo designation).

Example Sub-Block Architecture

It should be appreciated that non-volatile memory (NVM, such as flash memory) is typically segmented into blocks and pages. In recent designs, blocks have been getting larger as a way to increase bit storage per block. For some designs, these larger blocks are then split into sub-blocks. This disclosure relates in some aspects to various apparatuses, systems, methods, and media for utilizing a pseudo designation when determining the integrity of a sub-block of memory logically partitioned from another sub-block of memory residing in the same physical block (e.g., a physical block of flash NAND memory). Here, it should be appreciated that different sub-blocks have different bias settings for their associated wordlines, so a read of one sub-block (i.e., a "target" sub-block) can cause problems for the other sub-blocks (i.e., a "sister" sub-block). Moreover, when a read operation is performed on a particular sub-block, the read operation is effectively performed on the entire block, which may cause a read disturb on other sub-blocks of the block.

Figure 2:
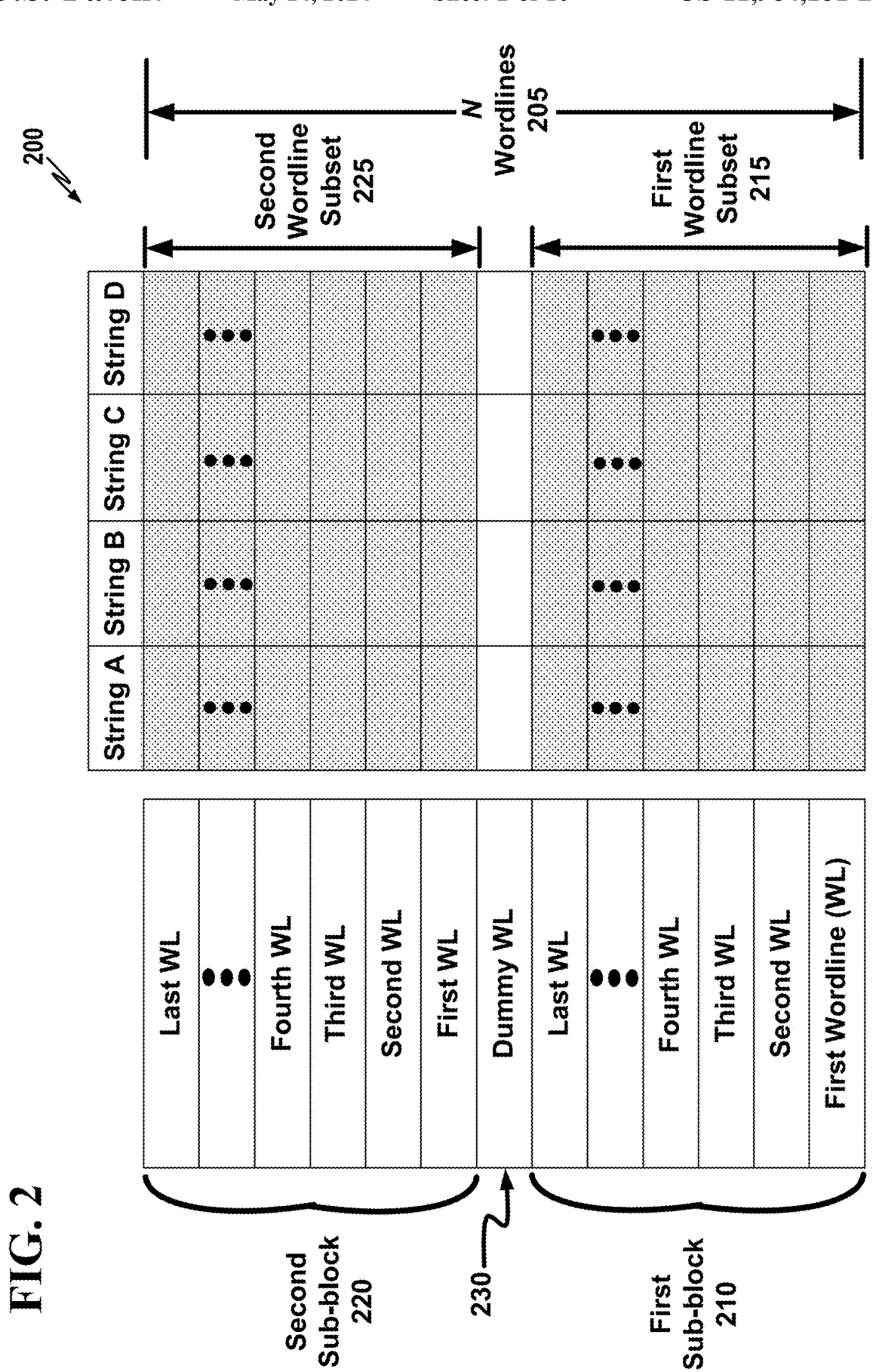
FIG. 2 illustrates a first exemplary sub-block architecture in accordance with one or more aspects of the disclosure.

For reference, an exemplary sub-block architecture is provided in FIG. 2. As illustrated, it is contemplated that a block 200 of NVM comprising N wordlines 205 may be partitioned into a first sub-block 210 comprising a first wordline subset 215 and a second sub-block 220 comprising a second wordline subset 220. Namely, although the first sub-block 210 and the second sub-block 220 reside on the same block 200, it is contemplated that they are physically separated from each other by a "dummy" wordline 230 and may be operated independently from each other. It is further contemplated that a dummy wordline, such as dummy wordline 230, can be physically the same as other wordlines, but configured to remain unprogrammed so as to separate sub-blocks from each other. Also, although only one dummy wordline 230 is shown in FIG. 2, it should be appreciated that multiple dummy wordlines can be included in a single block so as to further partition the block into more sub-blocks.

As used herein, the term "block" refers to a physical portion of an NVM that is the smallest addressable unit of the NVM. It should also be appreciated that the block, as used herein, may include two or more sub-blocks, wherein each sub-block may include two or more pages. Although a block is the smallest addressable unit of an NVM, it should be further appreciated that data can also be read and written at the page level. It is contemplated, however, that an erasure is typically performed only on the block level.

In an aspect of the disclosure, an SSD, a memory controller, a programmer device, or some other suitable device may be configured to determine whether operations performed on a target sub-block have adversely disturbed a sister sub-block. As used herein, a target sub-block refers to a sub-block in which an operation is performed (e.g., a read operation, a write operation, etc.), whereas a sister sub-block refers to a sub-block residing in a same block as a target sub-block. Aspects disclosed herein include performing a test on a target sub-block (e.g., first sub-block 210) to determine whether a read scrub of a sister sub-block (e.g., second sub-block 210) is appropriate.

For purposes of illustration, various aspects of the disclosure will be described in the context of a memory system that includes NAND memory technology, although one of ordinary skill in the art would appreciate that NOR memory technology may also be applicable. A NAND device may be referred to herein as a NAND Flash memory, a NAND memory device, a NAND flash, or a NAND. Generally speaking, a NAND device is a non-volatile memory having high storage density, fast access time, low power requirements in operation and advantageous shock resistance, compared to more conventional memory platforms. Raw NAND devices may be equipped (e.g., configured) with a serial interface such as Open NAND Flash Interface (ONFi), Common Flash Memory Interface (CFI), and the like. NAND devices may be configured as discrete memory chips or packaged with a controller to form a secure digital (SD) memory card, Multi Media Card (MMC), or a solid state disk. A NAND device may be configured with a single flash die, or a plurality of dies. In addition to memory cells, a NAND device may include other components, such as control/address logic components, I/O components, and data register components. It should be appreciated that the teachings herein are also applicable to other forms of memory (e.g., NVM other than NAND devices).

As previously stated, although read scrub algorithms are designed to keep a check on the quality of data stored in each physical block of a NAND device, conventional read scrub algorithms are inadequate for architectures in which a physical block is logically partitioned into sub-blocks. Namely, when applied to a sub-block architecture, conventional read scrub methods in which data in one sub-block is automatically relocated to a new location upon detecting a failure in another sub-block may be inapplicable and/or inefficient.

In view of the above deficiencies, the disclosure relates in some aspects to utilizing a pseudo designation, in response to detecting a failure in a first sub-block of non-volatile memory (e.g., NAND memory), when evaluating the integrity of a second sub-block. These aspects and other aspects of the disclosure will now be described in more detail in conjunction with the Figures disclosed herein.

Figure 3:
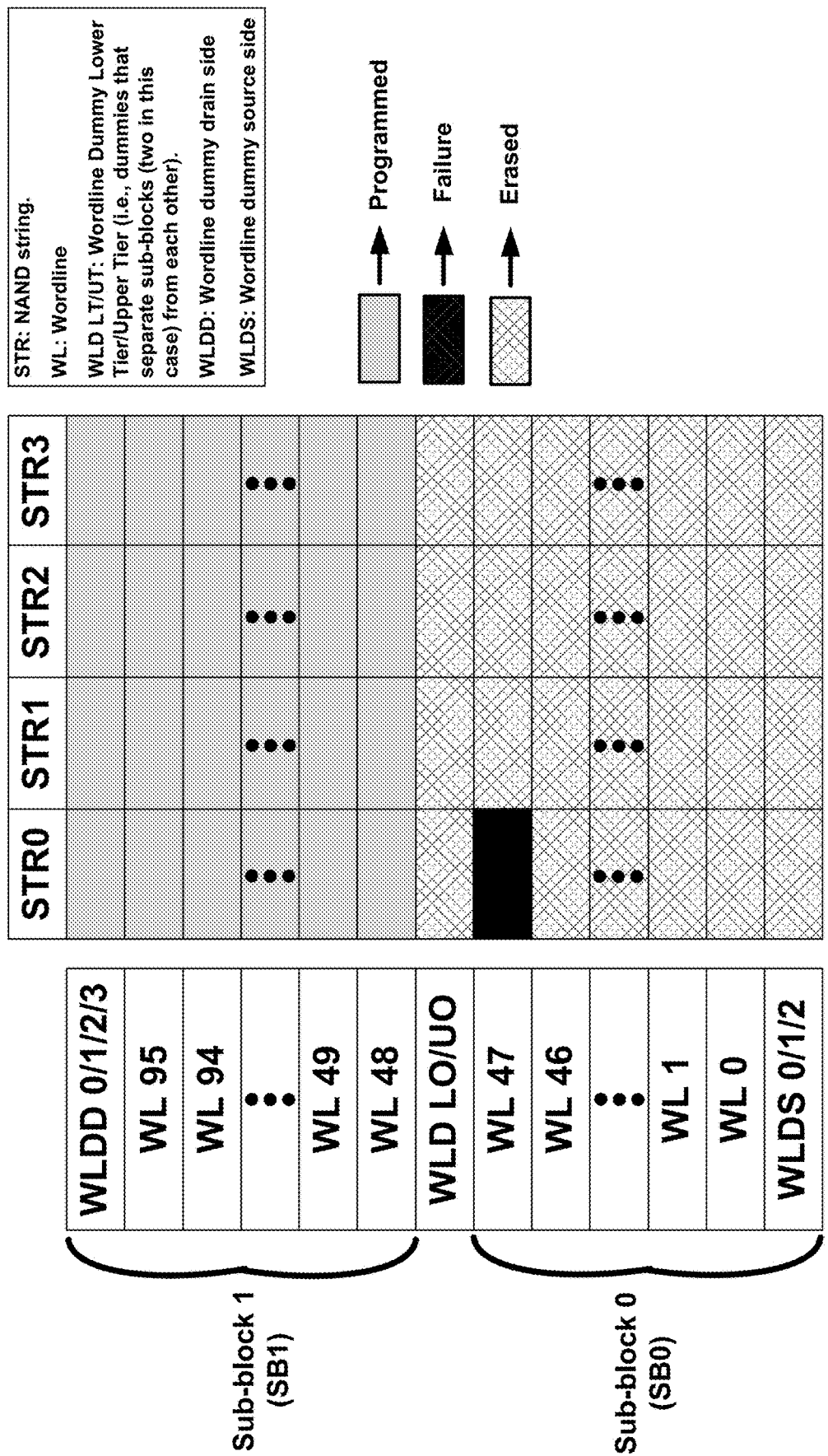
FIG. 3 illustrates a second exemplary sub-block architecture in accordance with one or more aspects of the disclosure.
Figure 4:
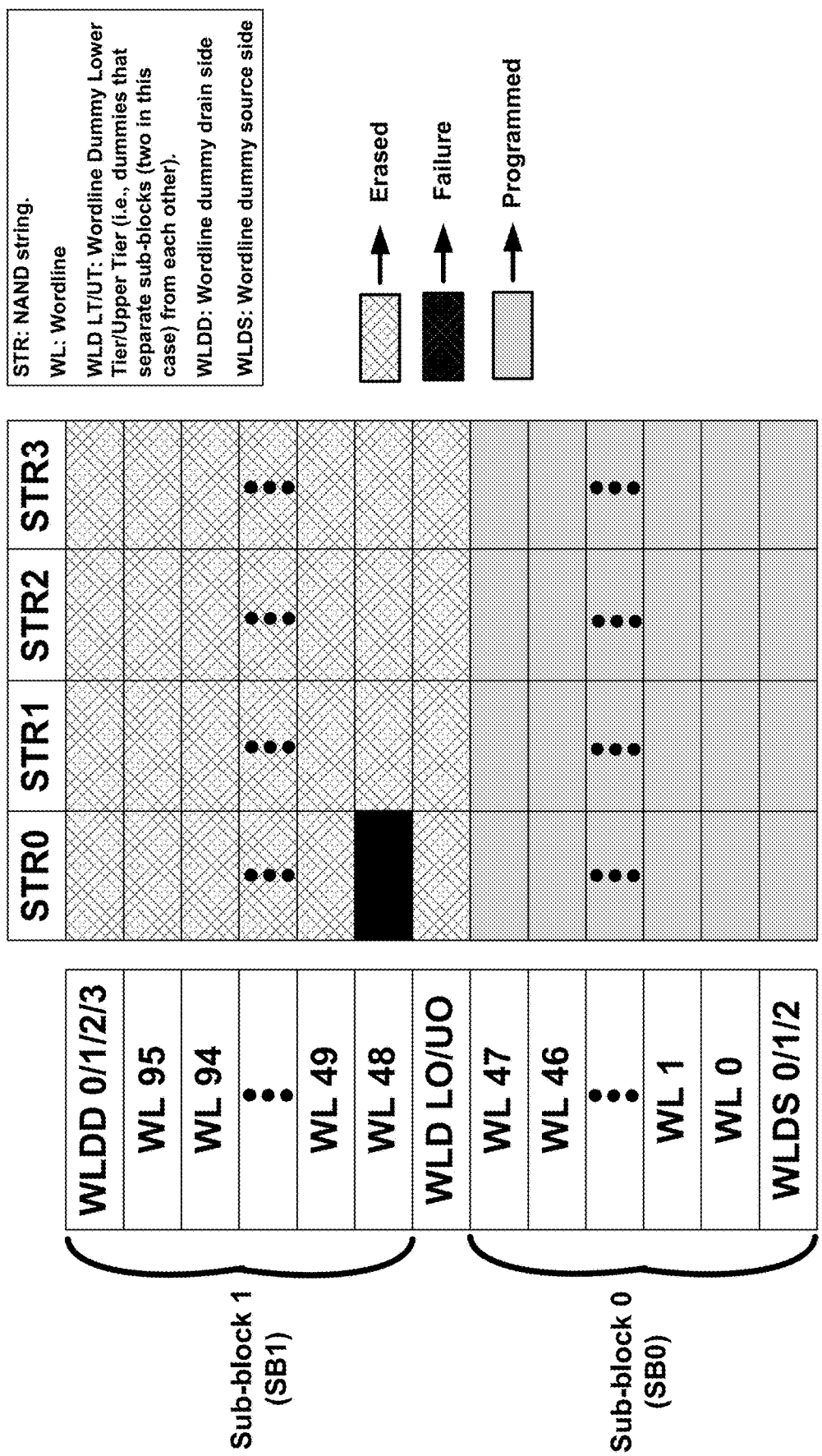
FIG. 4 illustrates a third exemplary sub-block architecture in accordance with one or more aspects of the disclosure.

Referring next to FIG. 3, an exemplary sub-block architectures is provided in accordance with one or more aspects of the disclosure. As illustrated, a physical block is logically partitioned into a first sub-block (i.e., sub-block 0) and a second sub-block (i.e., sub-block 1). Because of their physical proximity to each other, it is anticipated that sub-blocks residing in a same physical block will be particularly susceptible to read disturbs. For the architecture illustrated in FIG. 3, for instance, an operation performed on wordline 47 of sub-block 0 may have subsequently been detected as a failure (i.e., where the failure is detected when sub-block 0 is a "target" sub-block), wherein the cause of the failure may or may not have adversely affected sub-block 1 (i.e., where sub-block 1 is the "sister" sub-block of sub-block 0). Similarly, in FIG. 4, an operation performed on wordline 48 of sub-block 1 may have subsequently been detected as a failure (i.e., where the failure is detected when sub-block 1 is a target sub-block), wherein the cause of the failure may or may not have adversely affected sub-block 0 (i.e., where sub-block 0 is the sister sub-block of sub-block 1). For each of FIGS. 3 and 4, it should be appreciated that: "STR" refers to a NAND string; "WLD LT/UT" refers to Wordline Dummy Lower Tier/Upper Tier (i.e., dummies that separate sub-blocks (two in this case) from each other); "WLDD" refers to a Wordline dummy on the drain side; and "WLDS" refers to a Wordline dummy on the source side.

Here, it should be appreciated that a sub-block mode design in which a sister sub-block is automatically retired as a preemptive measure whenever a target sub-block failure is detected (e.g., a program failure, erase failure, read failure, etc.), is inefficient since the cause of the failure might not have affected the sister sub-block. Moreover, blindly deeming a sister sub-block unusable whenever a failure is detected in a target sub-block is inefficient since the failure may have been caused by a local issue that only affects the target sub-block, rather than a global issue (e.g., any leak/defect in a non-data wordline which is shared) affecting both the target sub-block and the sister sub-block.

In order to overcome this issue during the course of operation (e.g., during SSD run time), an aspect disclosed herein is directed towards assigning a pseudo grown bad block (pGBB) designation to sister sub-blocks once a target sub-block failure is detected. For instance, within such embodiment, a sister sub-block of a target sub-block in which a failure was detected may designated as a pseudo GBB until further testing confirms that the sub-block is indeed unusable, wherein the pseudo GBB designation is replaced with a grown bad block (GBB) designation.

In an exemplary die sort (D/S) test flow, it should be appreciated that tests may be performed to ascertain whether a given sub-block is a useable sub-block or a factory marked bad block. A sub-block that fails a particular group of tests is run through sub-block mode testing for sub-block recovery. If these sub-blocks pass the sub-block mode recovery tests, then these blocks are made available for system usage.

In an aspect disclosed herein, these tests performed during sub-block mode recovery are leveraged and added as part of system checks. For instance, when a target sub-block fails an operation (e.g., a program operation, erase operation, read operation, etc.), instead of blindly marking the sister sub-block as a GBB, the sister sub-block is flagged as a pGBB.

When a sister sub-block is flagged as a pGBB, it is contemplated that the sister sub-block will not be released for system usage. Hence, if a pGBB flag is set, the system will treat the sister sub-block as a GBB until the pGBB designation is released, if at all. In order to determine whether to remove a pGBB designation should be removed, it is contemplated that the system will perform various tests on the sister sub-block to determine its validity. Such tests may include any of various sub-block mode recovery tests (e.g., Sub-block Linear Combination (SLC) erase, SLC program, SLC read, SLC read random etc.), wherein at least two outcomes may arise.

In a first outcome, if the sister sub-block fails these tests, then it can be concluded that the sister sub-block is indeed bad, wherein the pGBB designation is replaced with a GBB designation and added to a GBB list (i.e., indicating that the sister sub-block is unusable). If the sister sub-block passes these tests, however, it can be confirmed that the issue plaguing the target sub-block is a localized defect rather than a global issue. In these circumstances, the pGBB flag of the sister sub-block may be removed, which indicates to the system that the sister sub-block is indeed usable. Accordingly, by assigning a pGBB designation to the sister sub-block and subsequently concluding via further testing that the sister sub-block is usable, the methodology disclosed herein avoids prematurely marking the sister sub-block as a GBB which would be automatically retired.

Example Sub-Block Operations Utilizing a Pseudo Designation

Figure 5:
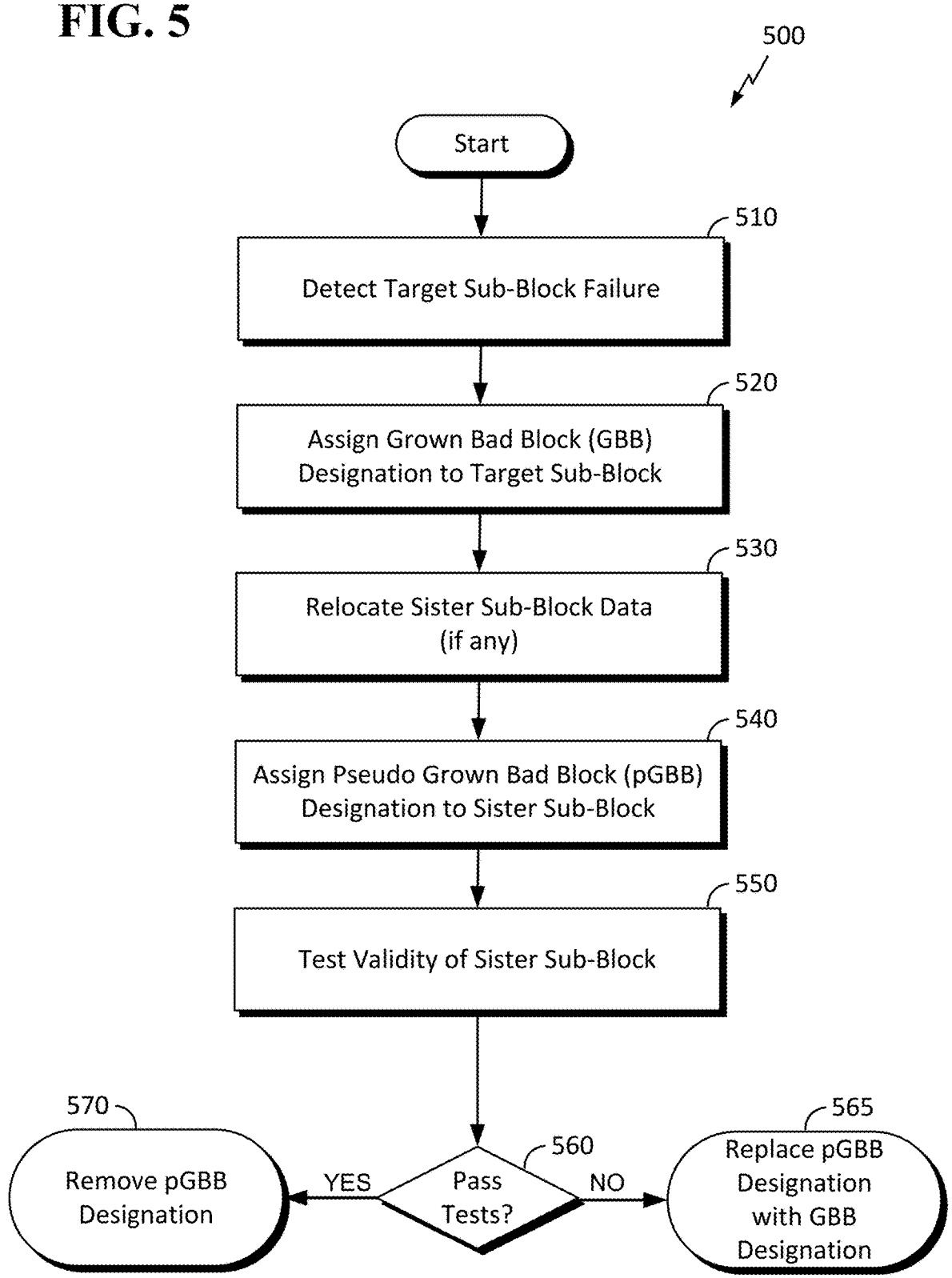
FIG. 5 illustrates exemplary operations for utilizing a pseudo designation to determine the integrity of a sub-block in accordance with one or more aspects of the disclosure.

FIG. 5 illustrates exemplary operations 500 for utilizing a pseudo designation to determine the integrity of a sub-block in accordance with the teachings herein. The operations 500 may take place within an SSD, an SSD drive, or some other suitable apparatus or apparatuses. For example, one or more of these operations may be performed by the controller 108 (e.g., the sub-block pseudo designation circuit 114) of FIG. 1.

At block 510, a controller (or other suitable apparatus) detects a failure on a target sub-block (e.g., a program failure, an erase failure, a read disturb failure, etc.), and subsequently designates the target sub-block as a grown bad block (GBB) at block 520. The operations 500 then proceed to block 530 where sister sub-block data (if any) is relocated.

After relocating data that may have resided in the sister sub-block, the operations 500 proceed to block 540 where the controller designates the sister sub-block as a pseudo grown bad block (pGBB). As previously stated, once a sub-block is assigned a pGBB designation, the sub-block is unusable by a system until further testing can confirm its validity at block 550. At block 560, the controller then determines whether the sister sub-block has adequately passed the testing performed at block 550. If the sister sub-block fails these tests, the operations 500 conclude at block 565 where the pGBB designation is replaced with a GBB designation and added to a GBB list (i.e., indicating that the sister sub-block is unusable). If the sister sub-block passes these tests, however, the operations 500 conclude at block 570 where the pGBB flag of the sister sub-block is removed, which indicates to the system that the sister sub-block is indeed usable.

Example Data Storage Device

Figure 6:
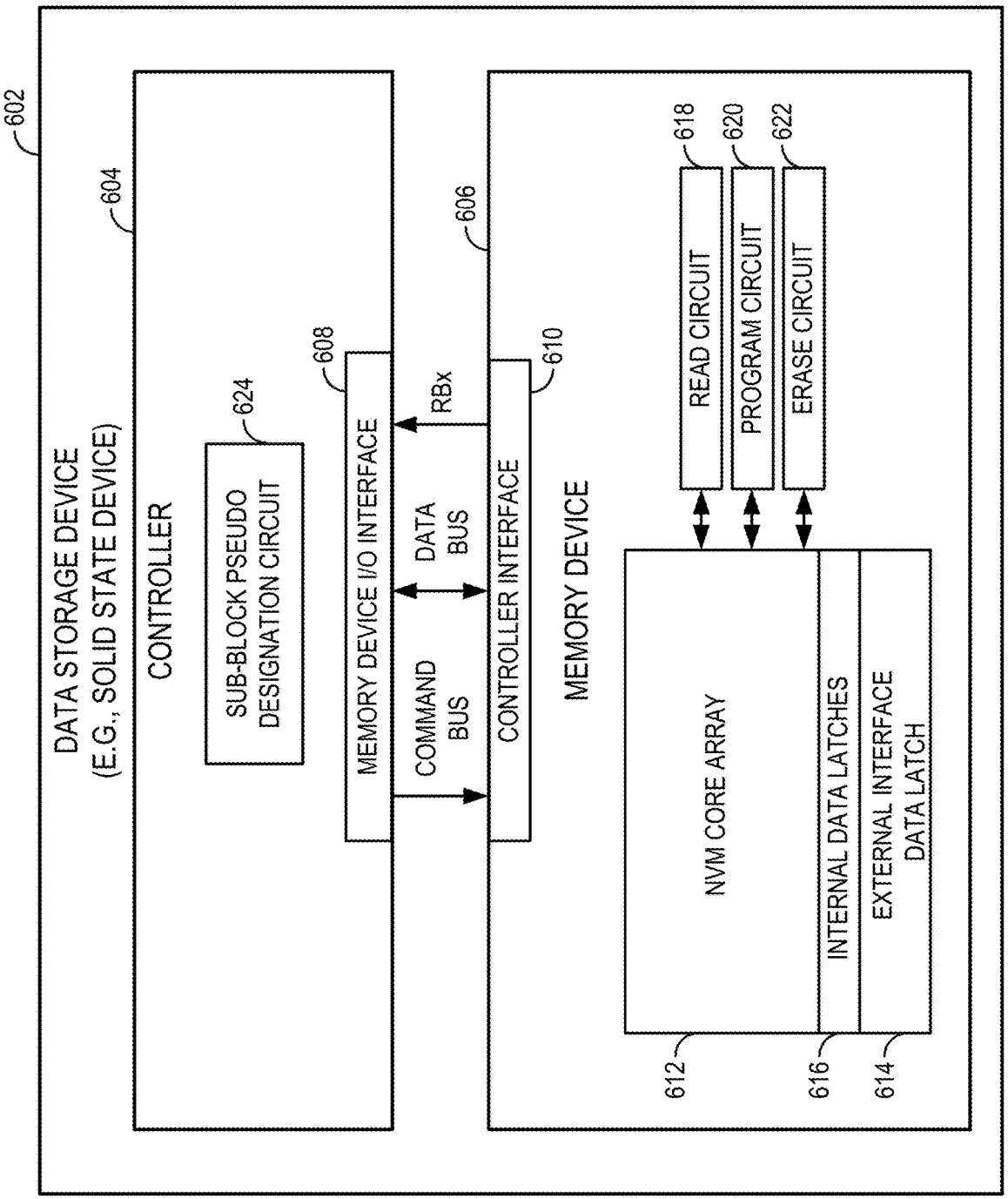
FIG. 6 illustrates an example data storage device (SSD) configured in accordance with one or more aspects of the disclosure.

FIG. 6 illustrates an embodiment of a data storage device 602 (e.g., an SSD drive) that may perform read scrubs on sub-blocks as taught herein. The data storage device includes a controller 604 that writes data to and reads data from a memory device 606 (e.g., an NVM), and performs other associated data storage operations.

The controller 604 and the memory device 606 communicate with one another via corresponding interfaces. The controller 604 includes a memory device input/output (I/O) interface 608 for sending commands to the memory device (e.g., via a command bus), sending data to and receiving data from the memory device 606 (e.g., via a data bus), and for sending and receiving other signaling as applicable (e.g., a read/busy indication (RBx) generated by the memory device 606). Similarly, the memory device 606 includes a controller interface 610 for receiving commands from the controller 604 (e.g., via a command bus), sending data to and receiving data from the controller 604 (e.g., via a data bus), and for sending and receiving other signaling as applicable (e.g., RBx).

The memory device 606 includes an NVM core array 612 for storing data, an external interface data latch 614 for outputting stored data to and receiving data to be stored from the controller interface 610, and a set of internal data latches 616 for storing operational data that is used by the memory device 606. The memory device 606 also includes a read circuit 618 for reading data from the multi-tier NVM core array 612, a program circuit 620 for writing data to the multi-tier NVM core array 612, and an erase circuit 622 for erasing data in the multi-tier NVM core array 612.

In accordance with the teachings herein, the controller 604 includes a sub-block pseudo designation circuit 624 that may be configured to perform one or more of the operations described herein. For example, the sub-block pseudo designation circuit 624 may correspond to the sub-block pseudo designation circuit 114 of FIG. 1 and perform one or more of the sub-block pseudo designation operations described herein in conjunction with FIGS. 1-5 and 7-8.

Alternative Sub-Block Pseudo Designation Devices

Figure 7:
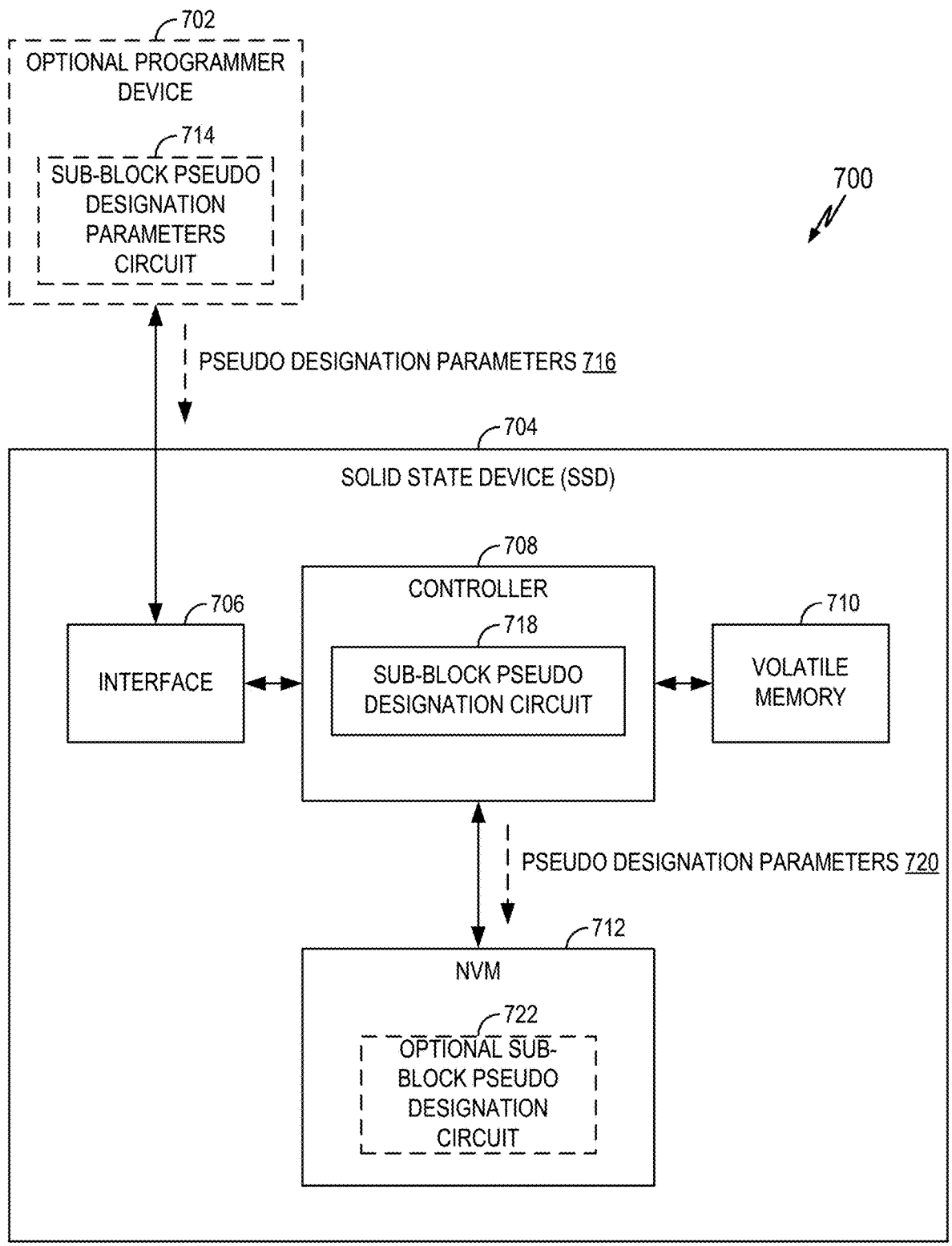
FIG. 7 illustrates an example of different devices for utilizing a pseudo designation to determine the integrity of a sub-block in accordance with one or more aspects of the disclosure.

The sub-block pseudo designation operations described herein may be performed by different devices in different implementations. The system 700 of FIG. 7 depicts an optional programmer device 702, and an SSD 704 communicatively coupled to the programmer device 702. The SSD 704 includes an interface 706, a controller 708, an optional memory 710, and a non-volatile memory (NVM) 712.

The programmer device 702 may be used, for example, during the manufacturing or testing of the SSD 704. The programmer device 702 includes a sub-block pseudo designation parameters circuit 714 for ascertaining pseudo designation parameters 716 for implementing the aspects disclosed herein on the SSD 704 when the NVM 712 is logically partitioned into sub-blocks.

In an embodiment that includes the programmer device 702, a sub-block pseudo designation circuit 718 of the controller 708 may select the set of pseudo designation parameters 720 to be used by the NVM 712 and send the selected set of pseudo designation parameters 720 to the NVM 712. For example, the sub-block pseudo designation circuit 718 may select the set of pseudo designation parameters 720 so as to define conditions for removing a pseudo designation (e.g., testing thresholds).

In some embodiments, the NVM 712 may include an optional sub-block pseudo designation circuit 722 for configuring the NVM 712 in accordance with the pseudo designation parameters 720. For example, the optional sub-block pseudo designation circuit 722 may be configured to perform one or more of the operations described herein. For instance, the optional sub-block pseudo designation circuit 722 may correspond to the sub-block pseudo designation circuit 114 of FIG. 1 and perform one or more of the sub-block pseudo designation operations described herein in conjunction with FIGS. 1-6 and 8.

Example Apparatus

Figure 8:
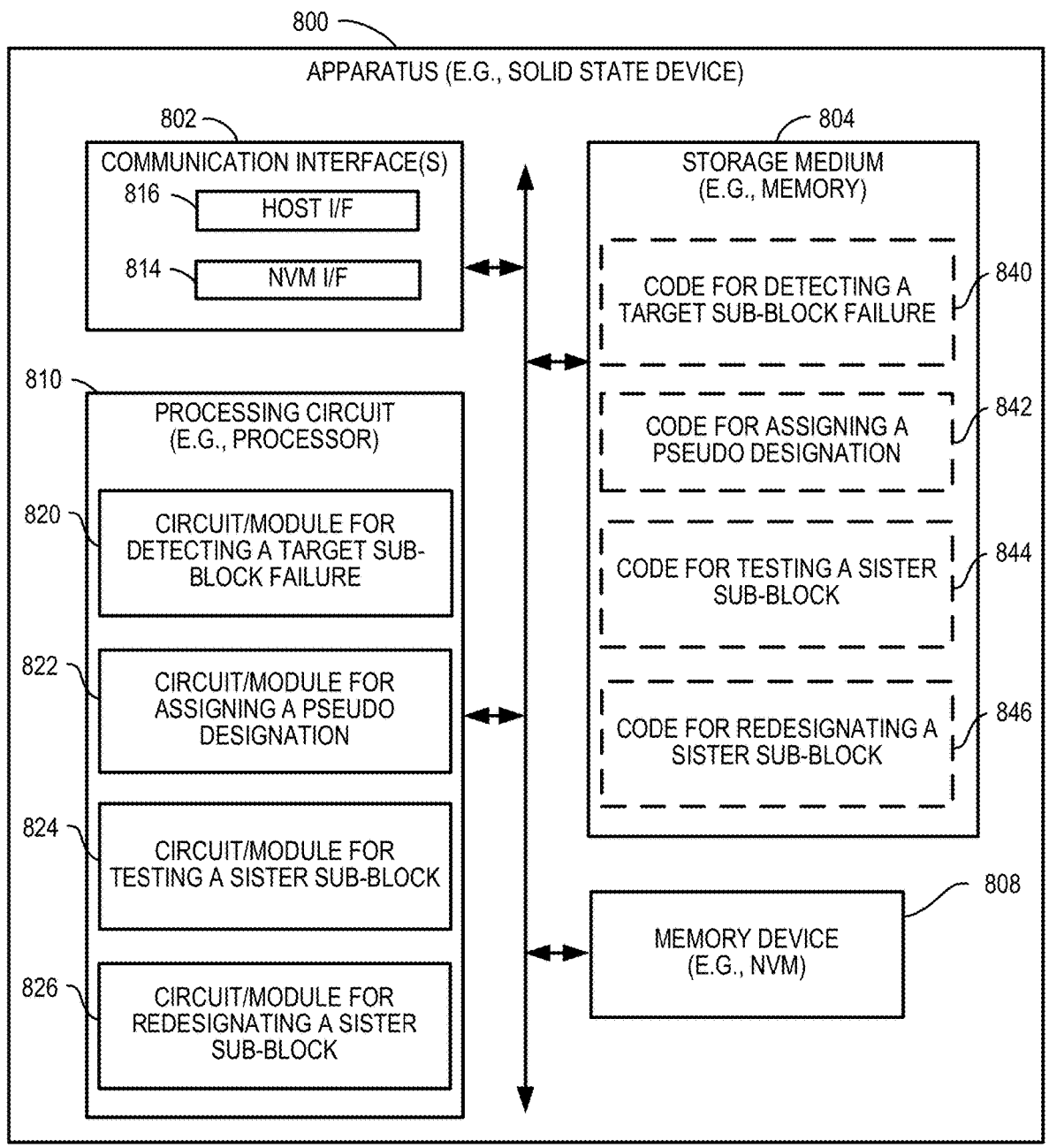
FIG. 8 illustrates an example hardware implementation for an apparatus (e.g., an electronic device) for utilizing a pseudo designation to determine the integrity of a sub-block in accordance with one or more aspects of the disclosure.

FIG. 8 illustrates an embodiment of an apparatus 800 configured to communicate according to one or more aspects of the disclosure. The apparatus 800 could embody or be implemented within a memory controller, an SSD, an SSD drive, a host device, an NVM device, a NAND die, or some other type of device that supports data storage. In various implementations, the apparatus 800 could embody or be implemented within a computing device, a personal computer, a portable device, or workstation, a server, a personal digital assistant, a digital camera, a digital phone, an entertainment device, a medical device, or any other electronic device that stores data.

The apparatus 800 includes a communication interface 802, a storage medium 804, a memory device (e.g., an NVM memory circuit) 808, and a processing circuit 810 (e.g., at least one processor and/or other suitable circuitry). These components can be coupled to and/or placed in electrical communication with one another via a signaling bus or other suitable component, represented generally by the connection lines in FIG. 8. The signaling bus may include any number of interconnecting buses and bridges depending on the specific application of the processing circuit 810 and the overall design constraints. The signaling bus links together various circuits such that each of the communication interface 802, the storage medium 804, and the memory device 808 are coupled to and/or in electrical communication with the processing circuit 810. The signaling bus may also link various other circuits (not shown) such as timing sources, peripherals, voltage regulators, and power management circuits, which are well known in the art, and therefore, will not be described any further.

The communication interface 802 provides a means for communicating with other apparatuses over a transmission medium. In some implementations, the communication interface 802 includes circuitry and/or programming (e.g., a program) adapted to facilitate the communication of information bi-directionally with respect to one or more devices in a system. In some implementations, the communication interface 802 may be configured for wire-based communication. For example, the communication interface 802 could be a bus interface, a send/receive interface, or some other type of signal interface including drivers, buffers, or other circuitry for outputting and/or obtaining signals (e.g., outputting signal from and/or receiving signals into an integrated circuit). The communication interface 802 serves as one example of a means for receiving and/or a means for transmitting.

The memory device 808 may represent one or more memory devices. As indicated, the memory device 808 may maintain mapping information 818 along with other information used by the apparatus 800. In some implementations, the memory device 808 and the storage medium 804 are implemented as a common memory component. The memory device 808 may also be used for storing data that is manipulated by the processing circuit 810 or some other component of the apparatus 800.

The storage medium 804 may represent one or more computer-readable, machine-readable, and/or processor-readable devices for storing programming, such as processor executable code or instructions (e.g., software, firmware), electronic data, databases, or other digital information. The storage medium 804 may also be used for storing data that is manipulated by the processing circuit 810 when executing programming. The storage medium 804 may be any available media that can be accessed by a general purpose or special purpose processor, including portable or fixed storage devices, optical storage devices, and various other mediums capable of storing, containing or carrying programming.

By way of example and not limitation, the storage medium 804 may include a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The storage medium 804 may be embodied in an article of manufacture (e.g., a computer program product). By way of example, a computer program product may include a computer-readable medium in packaging materials. In view of the above, in some implementations, the storage medium 804 may be a non-transitory (e.g., tangible) storage medium. For example, the storage medium 804 may be a non-transitory computer-readable medium storing computer-executable code, including code to perform operations as described herein.

The storage medium 804 may be coupled to the processing circuit 810 such that the processing circuit 810 can read information from, and write information to, the storage medium 804. That is, the storage medium 804 can be coupled to the processing circuit 810 so that the storage medium 804 is at least accessible by the processing circuit 810, including examples where at least one storage medium is integral to the processing circuit 810 and/or examples where at least one storage medium is separate from the processing circuit 810 (e.g., resident in the apparatus 800, external to the apparatus 800, distributed across multiple entities, etc.).

Programming stored by the storage medium 804, when executed by the processing circuit 810, causes the processing circuit 810 to perform one or more of the various functions and/or process operations described herein. For example, the storage medium 804 may include operations configured for regulating operations at one or more hardware blocks of the processing circuit 810, as well as to utilize the communication interface 802 for wireless communication utilizing their respective communication protocols.

The processing circuit 810 is generally adapted for processing, including the execution of such programming stored on the storage medium 804. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise.

The processing circuit 810 is arranged to obtain, process and/or send data, control data access and storage, issue commands, and control other desired operations. The processing circuit 810 may include circuitry configured to implement desired programming provided by appropriate media in at least one example. For example, the processing circuit 810 may be implemented as one or more processors, one or more controllers, and/or other structure configured to execute executable programming. Examples of the processing circuit 810 may include a general purpose processor, a digital signal processor (DSP), an application-specific integrated circuit (ASIC), a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 810 may also be implemented as a combination of computing components, such as a combination of a controller and a microprocessor, a number of microprocessors, one or more microprocessors in conjunction with an ASIC and a microprocessor, or any other number of varying configurations. These examples of the processing circuit 810 are for illustration and other suitable configurations within the scope of the disclosure are also contemplated.

According to one or more aspects of the disclosure, the processing circuit 810 may be adapted to perform any or all of the features, processes, functions, operations and/or routines for any or all of the apparatuses described herein. For example, the processing circuit 810 may be configured to perform any of the steps, functions, and/or processes described with respect to FIGS. 1-7, and 9. As used herein, the term "adapted" in relation to the processing circuit 810 may refer to the processing circuit 810 being one or more of configured, employed, implemented, and/or programmed to perform a particular process, function, operation and/or routine according to various features described herein.

The processing circuit 810 may be a specialized processor, such as an application-specific integrated circuit (ASIC) that serves as a means for (e.g., structure for) carrying out any one of the operations described in conjunction with FIGS. 1-7, and 9. The processing circuit 810 serves as one example of a means for sending and/or a means for receiving. In various implementations, the processing circuit 810 may provide and/or incorporate, at least in part, the functionality described above for the controller 108 or the SSD 104 of FIG. 1.

According to at least one example of the apparatus 800, the processing circuit 810 may include one or more of a circuit/module for detecting a target sub-block failure 820, a circuit/module for assigning a pseudo designation 822, a circuit/module for testing a sister sub-block 824, or a circuit/module for redesignating a sister sub-block 826. In various implementations, the circuit/module for detecting a target sub-block failure 820, the circuit/module for assigning a pseudo designation 822, the circuit/module for testing a sister sub-block 824, or the circuit/module for redesignating a sister sub-block 826 may provide and/or incorporate, at least in part, the functionality described above for the controller 108 of FIG. 1.

As mentioned above, a program stored by the storage medium 804, when executed by the processing circuit 810, causes the processing circuit 810 to perform one or more of the various functions and/or process operations described herein. For example, the program may cause the processing circuit 810 to perform the various functions, steps, and/or processes described herein with respect to FIGS. 1-7, and 9 in various implementations. As shown in FIG. 8, the storage medium 804 may include one or more of code for detecting a target sub-block failure 840, code for assigning a pseudo designation 842, code for testing a sister sub-block 844, or code for redesignating a sister sub-block 846. In various implementations, the code for detecting a target sub-block failure 840, the code for assigning a pseudo designation 842, the code for testing a sister sub-block 844, or the code for recategorizing a sister sub-block 846 may be executed or otherwise used to provide the functionality described herein for the circuit/module for detecting a target sub-block failure 820, the circuit/module for assigning a pseudo designation 822, the circuit/module for testing a sister sub-block 824, or the circuit/module for redesignating a sister sub-block 826.

In a particular implementation, it is contemplated that the memory device 808 is an NVM comprising N wordlines partitioned into a first sub-block (e.g., a target sub-block) comprising a first subset of the N wordlines and a second sub-block (e.g., a sister sub-block) comprising a second subset of the N wordlines different than the first subset. Namely, it is contemplated that the apparatus 800 may be configured to utilize a pseudo designation when determining the integrity of a first sub-block of an NVM partitioned from a second sub-block of the NVM residing in the same physical block. For instance, it is contemplated that the circuit/module for detecting a target sub-block failure 820 and/or the code for detecting a target sub-block failure 840 are configured to detect a failure in a first sub-block (e.g., a program failure, an erase failure, a read disturb failure, etc.). It is further contemplated that the circuit/module for assigning a pseudo designation 822 and/or the code for assigning a pseudo designation 842 are configured to mark, in response to a failure detection in the first sub-block, the second sub-block with an initial designation as an unusable sub-block. It is also contemplated that the circuit/module for testing a sister sub-block 824 and/or the code for testing a sister sub-block 844 are configured to perform at least one test on the second sub-block to determine a usability of the second sub-block. And finally, it is contemplated that the circuit/module for redesignating a sister sub-block 826 and/or the code for redesignating a sister sub-block 846 are configured to mark, based on the at least one test, the second sub-block with a second designation that is one of a tested usable sub-block or a tested unusable sub-block-.

Further aspects of the apparatus 800 are also contemplated. For instance, before testing a second sub-block, it is contemplated that data residing in the second sub-block may be relocated. Accordingly, in an exemplary embodiment, the circuit/module for assigning a pseudo designation 822 and/or the code for assigning a pseudo designation 842 may be configured to relocate data residing in the second sub-block in response to the failure detection in the first sub-block.

In another aspect of the disclosure, it is contemplated that the apparatus 800 may be configured to support on the fly testing of the second sub-block. Namely, it is contemplated that the circuit/module for testing a sister sub-block 824 and/or the code for testing a sister sub-block 844 may be configured to perform the at least one test on the second sub-block during a run time of an SSD. For instance, within such embodiment, the circuit/module for testing a sister sub-block 824 and/or the code for testing a sister sub-block 844 may be configured to perform the at least one test on the second sub-block via firmware.

It should be appreciated that testing (e.g., wafer-level testing) of blocks (and sub-blocks) in a die generally occurs during memory testing at the wafer level in the factory using various testers and flows. Blocks that fail are typically marked as a factory-marked bad block (FBB). Once a packaged die is received by a customer, it is expected that the blocks in the die are functional, tested and adequate for system use. As previously stated, if for any reason a sub-block fails for program, erase or certain cases of read failure, then the sub-block is marked as grown bad block (GBB), conventional systems automatically mark the sister sub-block as bad since conventional systems have no way of knowing if the issue on the target sub-block is localized or a global block level issue. The on-the-fly testing disclosed herein attempts to mimic or emulate the different tests that were performed in the factory (e.g., to gauge whether blocks within a die can be used in an SSD) with the help of firmware to ascertain the integrity of the sister sub-block. To this end, it should be noted that there are multiple testing stages. For instance, a wafer level test (which may be one stage of manufacturing activities that include die sorting and wafer level burn in) may occur after wafer manufacturing.

Once good wafers have been identified, die level testing can be performed on the wafers (e.g., including tests such as the "known good die" test and "memory testing") to identify good dies from the given wafers and identify good blocks within the good dies. It is contemplated that the on-the fly testing disclosed herein may include certain elements from each of these tests pertaining to gauging whether blocks in a particular die can be deemed adequate for use in a system.

Figure 9:
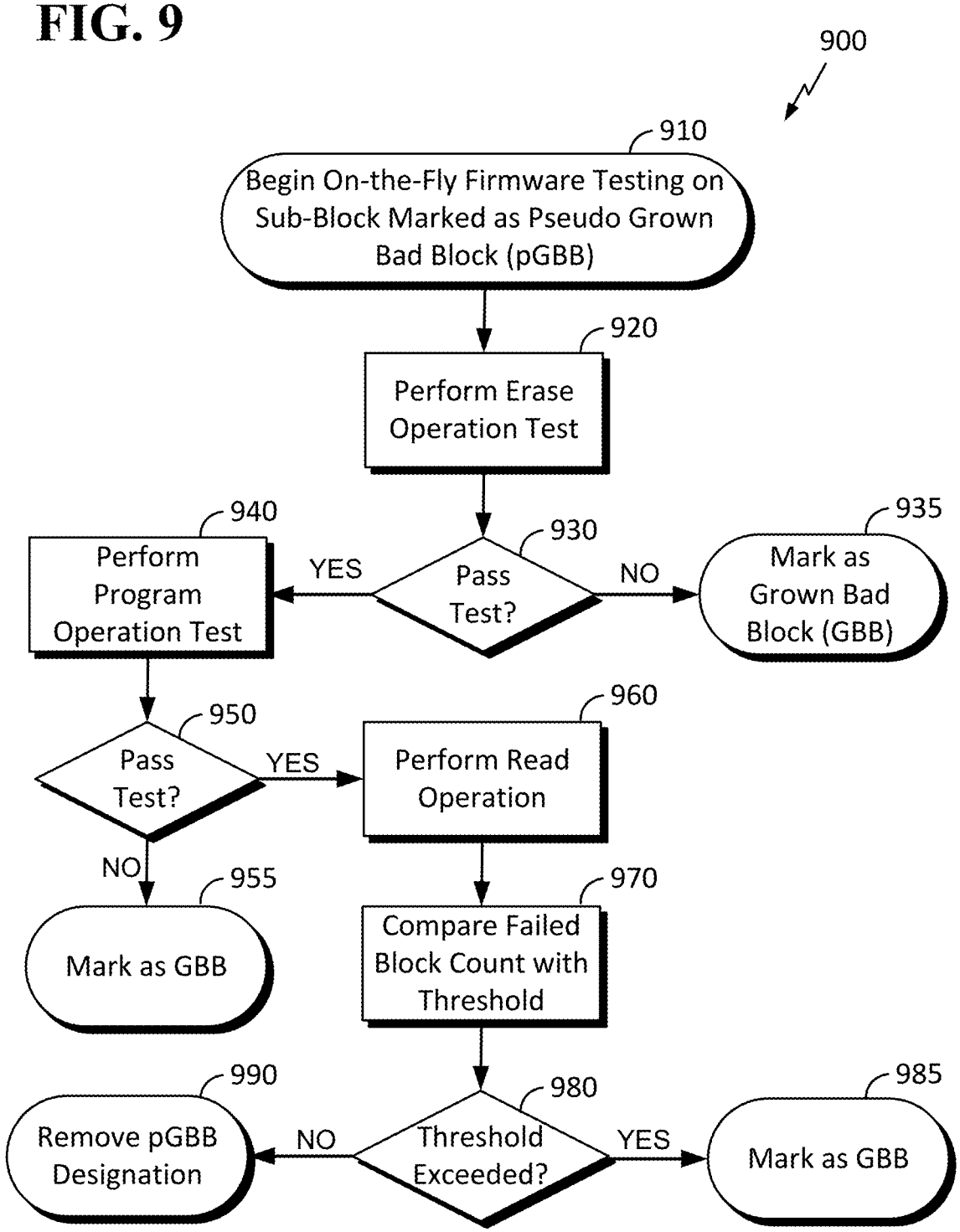
FIG. 9 illustrates an example process for utilizing firmware to perform on-the-fly testing in accordance with one or more aspects of the disclosure

FIG. 9 illustrates an exemplary process 900 for utilizing firmware to perform on-the-fly testing in accordance with aspects disclosed herein. The process 900 begins at block 910 where a sister sub-block marked as pseudo grown bad block (pGBB) is tested on-the-fly via firmware. At block 920, an erase operation test is performed on the sister sub-block (e.g., a sub-block linear combination (SLC) erase operation). At block 930, a determination is then made of whether the sister sub-block passed the erase operation test. If the sister sub-block failed the test, process 900 concludes at block 935 where the pGBB designation of the sister sub-block is replaced with a GBB designation. Otherwise, if the sister sub-block passes the erase test, process 900 proceeds to block 940 where a program operation test is performed (e.g., an SLC program operation).

At block 950, a determination is then made of whether the sister sub-block passed the program operation test. If the sister sub-block failed the test, process 900 concludes at block 955 where the pGBB designation of the sister sub-block is replaced with a GBB designation. Otherwise, if the sister sub-block passes the program test, process 900 proceeds to block 960 where a read operation test is performed.

At block 970, the failed block count (FBC) associated with the read operation test is compared with and FBC threshold. Process 900 then continues to block 980 where a determination is made of whether the FBC threshold has been exceeded. If the FBC threshold has indeed been exceeded, process 900 concludes at block 985 where the pGBB designation of the sister sub-block is replaced with a GBB designation. Otherwise, if the FBC threshold is not exceeded, process 900 concludes at block 990 where the pGBB designation is removed (i.e., the sister sub-block is deemed adequate for use). In one aspect, the thresholds used in blocks 930, 950, 980, and other thresholds used in process 900 can be kept exactly the same as the thresholds used in the testing processes described above. The tests performed during the testing processes described above may include, but are not limited to, performing specific erase/program/read operations on a sub-block and comparing the FBC to a certain threshold. The system may then emulate the erase/program/read portions of these tests on-the-fly. The remaining steps of these tests can include checking periphery signals and circuit integrity, which may not be sufficiently relevant to include in the on-the-fly testing disclosed herein. Thus, the system can choose variations of erase/program/read sub-tests used during different test insertions (e.g., testing processes described above), and emulate them to determine if a sister sub-block passes those tests, and if they do, the sub-block can be deemed good for usage.

As described above, the process 900 thus utilizes firmware to emulate wafer-level testing. As used herein, the term "emulate" can refer to the use of thresholds in the process 900 that correspond to, or exactly match, thresholds used in wafer-level testing. In another aspect, the term "emulate" can refer to process 900 performing one or more steps of a wafer-level test.

In yet another aspect of the disclosure, it is contemplated that the apparatus 800 may be configured to support "idle time" testing of a second sub-block, wherein idle time is defined herein as any time in which the apparatus 800 is not performing a memory-based operation (except for testing purposes), such as a read operation, a write operation, and/or an erase operation. Namely, it is contemplated that the circuit/module for testing a sister sub-block 824 and/or the code for testing a sister sub-block 844 may be configured to perform at least one test on the second sub-block during an idle time of an SSD.

It should be noted that, at any point if the SSD has serviced all the host requests and is powered on (i.e., idle time), it is contemplated that the firmware may begin its background operations including, but not limited to, any pending relocation, garbage collection etc. In an exemplary implementation, all the pGBBs are marked and kept in a queue which is power cycle safe (e.g., by performing a periodic dump of the queue to the NAND to safeguard the pGBB list from an unexpected power shut down). Once the firmware detects that the SSD is idle and that there are no more host requests to service, it is contemplated that the firmware may start to perform checks on all the pGBBs present as part of the queue. Each block can also have a particular level assigned to it to ascertain up to which point of process 900 it has been tested (i.e., to avoid repetition of steps). Once a given pGBB has passed all required tests, the sub-block's pGBB status is removed (which removes it from the pGBB queue), and added back to the pool of "normal" blocks. However, if the sub-block fails at any point, the sub-block is marked as GBB and also removed from the pGBB queue. In a particular aspect of the disclosure, it is contemplated that all of the above steps are performed by firmware in the background.

Example Process

Figure 10:
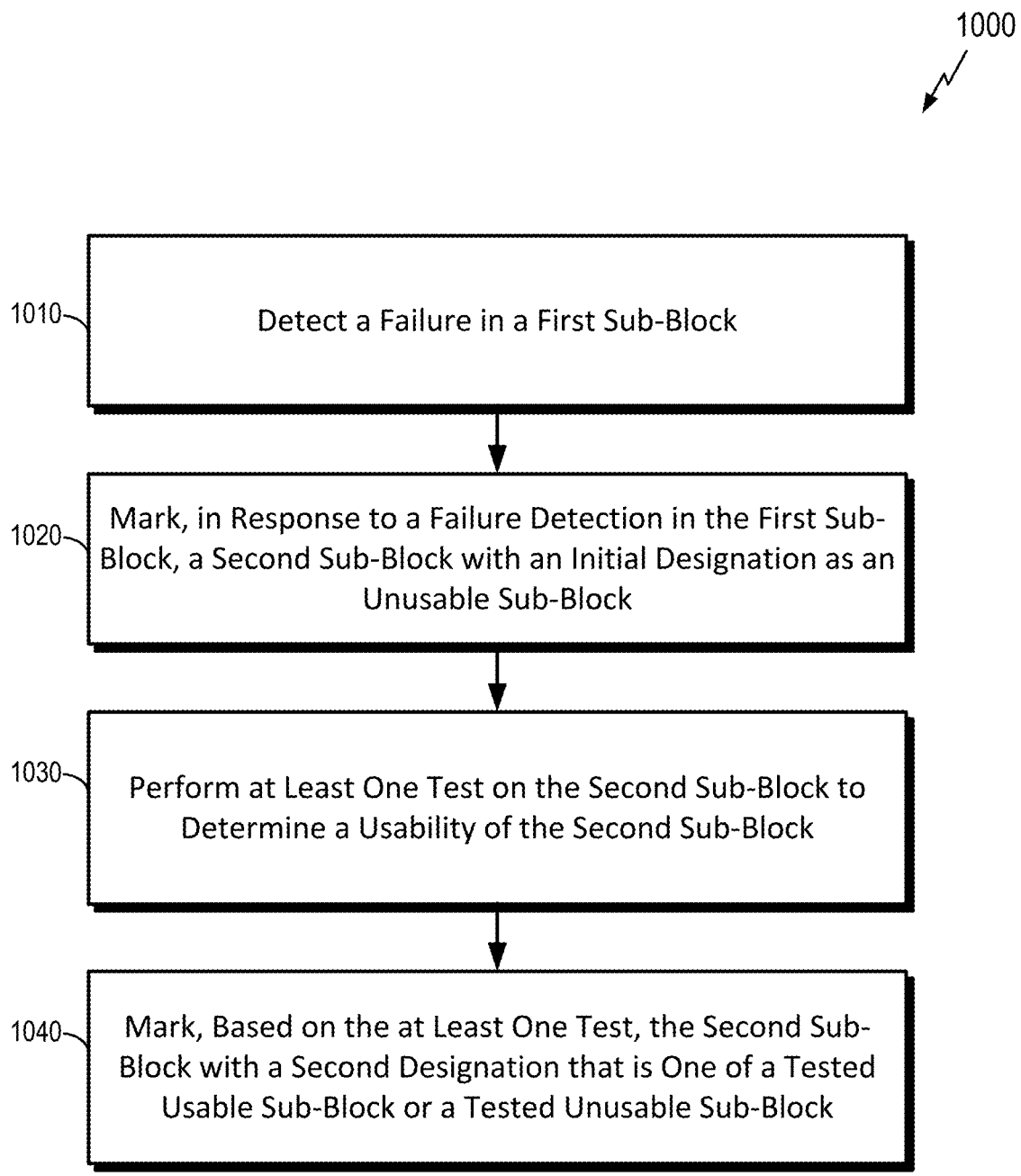
FIG. 10 illustrates an example process for utilizing a pseudo designation to determine the integrity of a sub-block in accordance with one or more aspects of the disclosure.

FIG. 10 illustrates a process 1000 for communication in accordance with some aspects of the disclosure. The process 1000 may take place within a processing circuit (e.g., the processing circuit 810 of FIG. 8), which may be located in a controller, an SSD, an SSD drive, a host device, an NVM device, a NAND die, or some other suitable apparatus. In a particular aspect of the disclosure, it is contemplated that the process 1000 is a data storage method operable on an NVM (e.g., memory device 808) in which the NVM includes a block comprising N wordlines partitioned into a first sub-block (e.g., a target sub-block) comprising a first subset of the N wordlines and a second sub-block (e.g., a sister sub-block) comprising a second subset of the N wordlines different than the first subset. Of course, in various aspects within the scope of the disclosure, the process 1000 may be implemented by any suitable apparatus capable of supporting memory-related operations. As described below, some or all illustrated features may be omitted in a particular implementation within the scope of the present disclosure, and some illustrated features may not be required for implementation of all embodiments.

The process 1000 begins at block 1010 with the apparatus (e.g., apparatus 800) detecting a failure in a first sub-block (i.e., a target sub-block). At block 1020, the process 1000 proceeds with the apparatus (e.g., apparatus 800) marking, in response to a failure detection in the first sub-block, a second sub-block (i.e., a sister sub-block) with an initial designation as an unusable sub-block. The process 1000 then continues at block 1030 where the apparatus (e.g., apparatus 800) performs at least one test on the second sub-block to determine a usability of the second sub-block. At block 1040, the process 1000 then concludes with the apparatus (e.g., apparatus 800) marking, based on the at least one test, the second sub-block with a second designation that is one of a tested usable sub-block or a tested unusable sub-block.

In some aspects, a process in accordance with the teachings herein may include any combination of the above operations.

Additional Aspects

The examples set forth herein are provided to illustrate certain concepts of the disclosure. The apparatuses, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein. Examples of computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise.

The terminology used herein is for the purpose of describing particular aspects only and is not intended to be limiting of the aspects. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," an variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of a, b, or c" or "a, b, c, or any combination thereof" used in the description or the claims means "a or b or c or any combination of these elements." For example, this terminology may include a, or b, or c, or a and b, or a and c, or a and b and c, or 2a, or 2b, or 2c, or 2a and b, and so on.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. A data storage apparatus, comprising:
a non-volatile memory, wherein:
the non-volatile memory includes a block comprising N wordlines physically partitioned on the block into a first sub-block and a second sub-block;
the first sub-block comprises a first subset of the N wordlines; and
the second sub-block comprises a second subset of the N wordlines different than the first subset; and
one or more processors, individually or in combination, configured to:
determine whether a failure has been detected in the first sub-block;
in response to determining that the failure has been detected in the first sub-block:
mark the second sub-block with an initial designation as a defective sub-block;
perform at least one test on the second sub-block to determine a usability of the second sub-block; and
mark, based on the at least one test, the second sub-block with a second designation that is one of a tested usable sub-block or a tested defective sub-block; and in response to determining that the failure has not been detected in the first sub-block:
refrain from marking the second sub-block with the initial designation as a defective sub-block.

2. The data storage apparatus of claim 1, wherein the failure is associated with at least one of a program failure, an erase failure, or a read disturb failure.

3. The data storage apparatus of claim 1, wherein the one or more processors is further configured to relocate data stored in the second sub-block in response to the failure in the first sub-block and before marking the second sub-block with the initial designation.

4. The data storage apparatus of claim 1, wherein the one or more processors is further configured to perform the at least one test on the second sub-block during a run time of a solid state device (SSD) of the data storage apparatus.

5. The data storage apparatus of claim 4, wherein the one or more processors is further configured to perform the at least one test on the second sub-block via firmware.

6. The data storage apparatus of claim 1, wherein the one or more processors is further configured to perform the at least one test on the second sub-block during an idle time of a solid state device (SSD) of the data storage apparatus.

7. The data storage apparatus of claim 1, wherein the at least one test on the second sub-block comprises at least one of an erase test, a program test, or a read test.

8. The data storage apparatus of claim 1, wherein the first sub-block and the second sub-block are physically partitioned on the block by at least one dummy wordline.

9. The data storage apparatus of claim 1, wherein the one or more processors is further configured to, in response to determining that the failure has not been detected in the first sub-block:
refrain from performing the at least one test on the second sub-block.

10. A data storage method operable on a non-volatile memory, wherein the non-volatile memory includes a block comprising N wordlines physically partitioned on the block into a first sub-block and a second sub-block, and wherein the first sub-block comprises a first subset of the N wordlines and the second sub-block comprises a second subset of the N wordlines different than the first subset, the data storage method comprising:
determining whether a failure has been detected in the first sub-block;
in response to determining that the failure has been detected in the first sub-block:
marking the second sub-block with an initial designation as a defective sub-block;
performing at least one test on the second sub-block to determine a usability of the second sub-block; and
marking, based on the at least one test, the second sub-block with a second designation that is one of a tested usable sub-block or a tested defective sub-block; and
in response to determining that the failure has not been detected in the first sub-block:
refraining from marking the second sub-block with the initial designation as a defective sub-block.

11. The data storage method of claim 10, wherein the failure is associated with at least one of a program failure, an erase failure, or a read disturb failure.

12. The data storage method of claim 10, further comprising relocating data residing in the second sub-block in response to the failure.

13. The data storage method of claim 10, further comprising performing the at least one test on the second sub-block during a run time of a solid state device (SSD).

14. The data storage method of claim 13, further comprising performing the at least one test on the second sub-block via firmware.

15. The data storage method of claim 10, further comprising performing the at least one test on the second sub-block during an idle time of a solid state device (SSD).

16. The data storage method of claim 10, wherein the at least one test on the second sub-block comprises at least one of an erase test, a program test, or a read test.

17. The data storage method of claim 10, further comprising physically partitioning the first sub-block and the second sub-block via at least one dummy wordline.

18. The data storage method of claim 10, further comprising, in response to determining that the failure has not been detected in the first sub-block:
refraining from performing the at least one test on the second sub-block.

19. A data storage apparatus, comprising:
a non-volatile memory, wherein the non-volatile memory includes a block comprising N wordlines physically partitioned on the block into a first sub-block and a second sub-block, and wherein the first sub-block comprises a first subset of the N consecutive wordlines and the second sub-block comprises a second subset of the N wordlines different than the first subset;
means for determining whether a failure has been detected in the first sub-block;
means for marking, in response to determining that the failure has been detected in the first sub-block, the second sub-block with an initial designation as a defective sub-block;
means for performing, in response to determining that the failure has been detected in the first sub-block, at least one test on the second sub-block to determine a usability of the second sub-block; and
means for marking, based on the at least one test and in response to determining that the failure has been detected in the first sub-block, the second sub-block with a second designation that is one of a tested usable sub-block or a tested defective sub-block; and
wherein the means for marking the second sub-block with the initial designation as the defective sub-block is configured to refrain, in response to determining that the failure has not been detected in the first sub-block, from marking the second sub-block with the initial designation as the defective sub-block.

20. The data storage apparatus of claim 19, further comprising means for relocating data residing in the second sub-block in response to the failure in the first sub-block.

21. The data storage apparatus of claim 19, further comprising means for performing the at least one test on the second sub-block during one of a run time or an idle time of a solid state device (SSD).

22. The data storage apparatus of claim 19, wherein the first sub-block and the second sub-block are physically partitioned on the block by at least one dummy wordline.

23. The data storage apparatus of claim 19, wherein the means for marking the second sub-block with the initial designation as the defective sub-block is further configured to refrain, in response to determining that the failure has not been detected in the first sub-block, from performing the at least one test on the second sub-block.

* * * * *